PHASE LOCKED CRYSTAL CONTROLLED OSCILLATOR

Filed June 6, 1966 2 Sheets-Sheet 1

INVENTOR.
GEORGE C. WILKINSON JR
BY Moody and Rintinger
ATTORNEYS

Oct. 3, 1967 G. C. WILKINSON, JR 3,345,579

PHASE LOCKED CRYSTAL CONTROLLED OSCILLATOR

Filed June 6, 1966

2 Sheets-Sheet 2

INVENTOR.
GEORGE C. WILKINSON JR.
BY
Moody and Kintzinger
ATTORNEYS 3,345,579
PHASE LOCKED CRYSTAL CONTROLLED OSCILLATOR George C. Wilkinson, Jr., Dallas, Tex., assignor to Collins Radio Company, Cedar Rapids, Iowa, a corporation of Iowa Filed June 6, 1966, Ser. No. 555,345
14 Claims. (Cl. 331—8)

Figure 1:
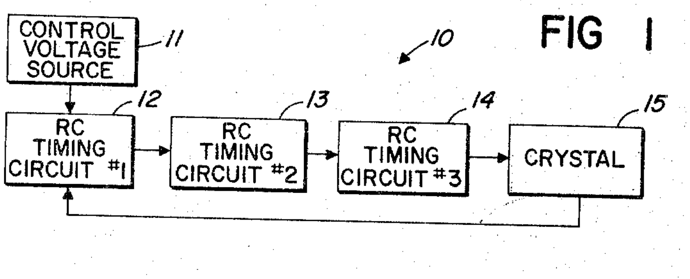

This invention relates in general to crystal controlled oscillators, and in particular, to a crystal controlled oscillator circuit wherein the output is frequency and phase locked to a lower strobe subharmonic frequency.

There are many existing oscillator circuits known in the art, and many of these are crystal controlled oscillator circuits. Generally these do not provide the fine degree phase and frequency control preciseness such as is provided by applicant's crystal controlled oscillator circuits with frequency and phase locked to a lower strobe subharmonic frequency. Further, many existing locked oscillator circuits simply are not compatible with thin film techniques, a factor of considerable import with the present increasing trend to thin film circuitry. Good reliable operation is important along with an extended frequency pull range. Another factor with some locked oscillator circuits is that drive and crystal waveforms vary over an excessive amplitude range.

It is, therefore, a principal object of this invention to provide a precisely controlled phase and frequency locked oscillator, with crystal control, phase locked to a lower strobe subharmonic frequency.

A further object is to provide such a phase and frequency locked crystal controlled oscillator fully compatible with thin film circuitry techniques.

Still another object of such locked oscillators is to provide clamped overdriven waveforms with drive and received waveforms from the controlling crystal being, respectively, of substantially the same amplitude regardless of the impedance of the crystal and variation in such impedance with phase and frequency shift.

Features of this invention useful in accomplishing the above objects include, in a phase locked crystal controlled oscillator, the use of RC timing circuitry to vary the phase of the waveform that drives the crystal thereby providing for precise phase and frequency control. Use is made of voltage clamped overdriven waveforms for the drive waveform and for the waveforms from the crystal to have predetermined and uniform amplitude, respectively, regardless of crystal impedance and variations thereof with phase and frequency shift. It should be noted that these improved useful phase locked oscillator circuits are provided without components such as voltage variable capacitors or other such components, and are therefore, particularly compatible with thin film circuitry techniques.

A specific embodiment representing what is presently regarded as the best mode for carrying out the invention is illustrated in the accompanying drawings.

Figure 2:
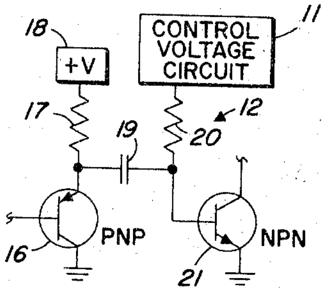
Figure 4:
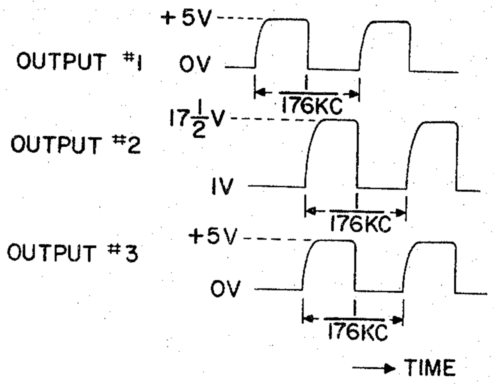
Figure 5:
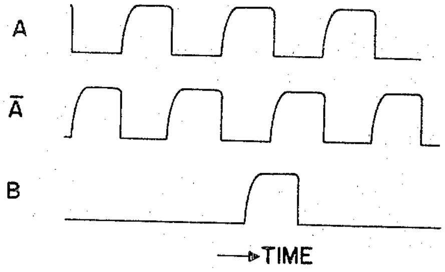
Figure 3:
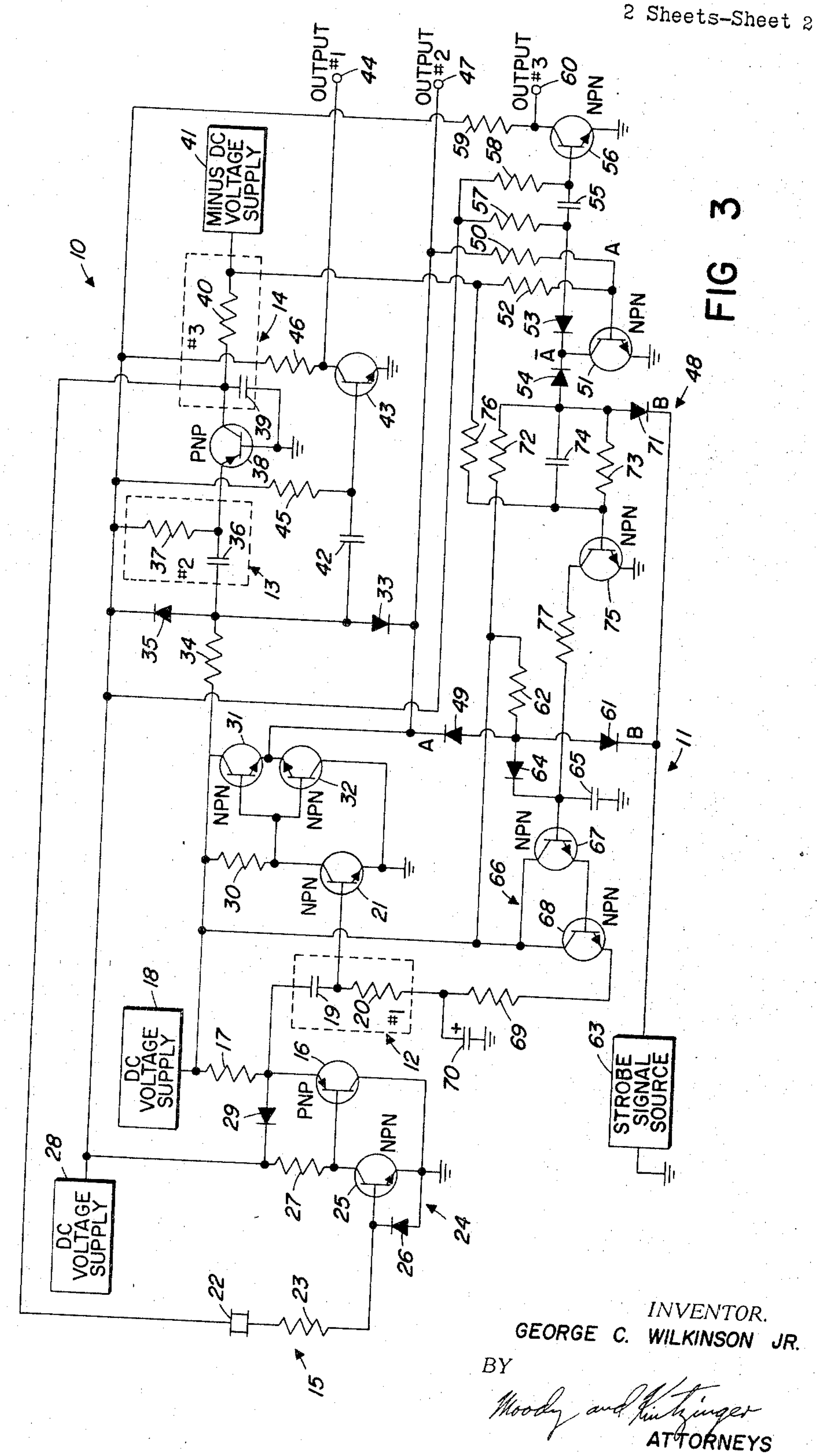

In the drawings:

FIGURE 1 represents a block diagram of a phase locked crystal controlled oscillator according to the invention;

FIGURE 2, a partial schematic showing detail of an RC timing circuit;

FIGURE 3, a schematic of a working phase locked crystal controlled oscillator;

FIGURE 4, first, second and third voltage waveforms developed, respectively, at three output terminals of the oscillator of FIGURE 3; and, FIGURE 5, voltage waveforms A and $\bar{A}$ developed at various locations in the oscillator circuit, and voltage waveform B a subharmonic strobe input pulse waveform to the oscillator of FIGURE 3 from a strobe signal source.

Referring to the drawings:

The phase locked crystal controlled oscillator circuit 10 of FIGURE 1 is shown to have a control voltage signal source 11 with an input connection to a first RC timing circuit 12 from which an output is applied as an input to a following RC timing circuit 13 in turn supplying an input to a third RC timing circuit 14. The output of RC timing circuit 14 is applied as an input frequency waveform to crystal oscillator circuit 15 from which an output connection extends a feedback as an input to the first RC timing circuit 12. It should be noted at this point that while a plurality of three RC timing circuits is employed in the particular oscillator circuit 10 illustrated, that a plurality of two RC timing circuits has been employed in such a working circuit, and that actually more than three may also be employed for such a phase locked oscillator system. Such phase locked crystal controlled oscillator circuits are designed for operation, particularly in the 10 kc. to 500 kc. range by successive frequency range steps with substitution of a series of crystals as appropriate for the various respective range portion steps. Basically the oscillator operates as an astable multivibrator with a crystal inserted in the loop for phase and thus frequency control. With the four main circuits, the three RC timing circuits 12, 13 and 14 and the crystal circuit 15 connected in series in a closed loop, the circuit operates as an oscillator when the sum of the phase shifts through the main components equals 360°.

Referring also to FIGURE 2, the first RC timing circuit 12 is shown to have an input connection to the emitter of PNP transistor 16, the collector of which is connected to ground, and to include a resistor 17 connected between positive voltage supply 18 and the emitter of PNP transistor 16. The signal path through RC timing circuit 12 is from the common junction of resistor 17 and the emitter of transistor 16 through capacitor 19 to the common junction of resistor 20, the other end of which is connected to control voltage developing circuit 11, and the base of NPN transistor 21. The emitter of transistor 21 is connected to ground, and its collector is in the output signal path from the transistor. This timing circuit 12 has such component values that with the control voltage developed, with the control voltage circuit, at its lowest developed predetermined value, the RC timing components result in substantially a 150° phase lag at the natural series resonance frequency of the crystal.

Referring also to FIGURE 3, the controlling crystal 22 of crystal circuit 15 is shown to be connected through resistor 23 and a Darlington amplifier circuit 24, including PNP transistor 16, to the first RC timing circuit 12. The input portion of Darlington amplifier 24 includes a base connection to NPN transistor 25, functioning as an emitter follower signal inverter with the emitter connected to ground, and a diode 26, connected cathode to the base connection of transistor 25 and anode to ground. The collector of NPN transistor 25 is connected through resistor 27 to positive voltage supply 28, and the signal path connection of the collector of transistor 25 is a connection directly to the base of PNP transistor 16. The common junction of the emitter of PNP transistor 16 and resistor 17 is connected to the anode of diode 29 and through the diode to positive voltage supply 28.

Transistor 21 is an emitter follower logic inverter with the emitter connected to ground and the collector connected through resistor 30 to positive voltage supply 18. The common junction of the collector of transistor 21 and resistor 30 is connected as the signal path to a common base connection of two NPN transistors 31 and 32 that are also provided with a common emitter output connection. The collector of transistor 31 is connected to positive voltage supply 18, and the collector of transistor 32 is connected to ground. The common emitter junction of NPN transistors 31 and 32 is connected to the cathode of diode 33 and through diode 33 to the common junction of resistor 34, connected at the other end to positive voltage supply 18, the anode of a diode 35, having a cathode connection to positive voltage supply 28, and capacitor 36, of the second RC timing circuit 13. The other side of capacitor 36 connected through resistor 37 to positive voltage supply 28 and also to the emitter of PNP transistor 38.

Transistor 38 acts as a common base logic switcher with its base connection to ground, and is the circuit signal path interconnection through its emitter collector circuit from the second RC timing circuit 13 to the third RC timing circuit 14. The collector of transistor 38 is connected to the common junction of a capacitor 39, connected to ground, resistor 40, connected to minus voltage supply 41, and a return line connection to crystal 22. A first output signal circuit path is provided from the anode of diode 33 through capacitor 42, the base to collector circuit of NPN transistor 43, the emitter of which is connected to ground, to output terminal 44. Voltage biasing is provided for transistor 43, in addition to the emitter connection to ground, by connection of the common junction of capacitor 42 and the base of transistor 43 through resistor 45 to positive voltage supply 28, and from the transistor collector through resistor 46 again to positive voltage supply 28. The common junction of the emitters of NPN transistors 31 and 32 is also directly connected to output terminal 47 as a second output of the phase locked crystal controlled oscillator circuit.

The common junction of NPN transistors 31 and 32 is also provided with two connections to the control voltage developing circuit 48 portion of control voltage signal source 11, one connection to the cathode of, and through diode 49, and the other connection through resistor 50 to the base of a logic inverter function NPN transistor 51, having an emitter connection to ground. The common junction of resistor 50 and the base of transistor 51 is connected through resistor 52 to minus voltage supply 41. The collector of transistor 51 is connected to the common junction between the cathodes of diodes 53 and 54. The anode of diode 53 is connected through capacitor 55 to the base of an NPN transistor 56 having an emitter connection to ground. Capacitor 55 and NPN transistor 56 are part of an RC timing and switching circuit including resistor 57, connected between the common junction of diode 53 and capacitor 55 to positive voltage supply 28, resistor 58, connected between the common junction of capacitor 55 and the base of transistor 56 to positive voltage supply 28, and resistor 59 connected between the collector of transistor 56 and positive DC voltage supply 28. Further, the collector of transistor 56 is connected to output terminal 60 as a third output of the phase locked crystal controlled oscillator circuit. The three respective outputs developed and their relative timings are as shown by the FIGURE 4 output waveforms 1 through 3.

Referring also to FIGURE 5, waveform A, actually the same shape as the second output developed, is inverted through logic inverter function transistor 51 to inverted waveform $\overline{A}$ appearing at the collector of transistor 51 and the common junction of diodes 53 and 54. Waveform A applied at the cathode of diode 49 affects action of a Nand gating circuit including the diode 49, diode 61, which are connected anode to anode, and a resistor 62 connected between the common junction of diodes 49 and 61 and positive voltage supply 28. Strobe signal source 63 develops a subharmonic frequency waveform B, relative to the natural frequency of the crystal 22 used, applied through a connection from signal source 63 to the cathode of diode 61. During the intervals of time when the pulses of waveform B are in coincidence with positive going pulses of waveform A both diodes 49 and 61 are simultaneously reverse biased. This permits a positive going voltage build-up to occur at the common junction of diodes 49 and 61 effective through diode 64, connected anode to the common junction of diodes 49 and 61 and resistor 62, to charge a storage capacitor 65, connected between the cathode of diode 64 and ground. The common junction of diode 64 and capacitor 65 is connected through a high impedance matching and amplifier circuit 66 to the first RC timing circuit 12. Circuit 66 includes NPN transistor 67 having a collector connection to positive voltage supply 18, a base connection to the common junction of diode 64 and capacitor 65, and an emitter connection to the base of NPN transistor 68. Transistor 68 of circuit 66 also has a collector connection to positive voltage supply 18, and an emitter connection through resistor 69 to resistor 20 of the first RC timing circuit 12. The common junction of resistors 69 and 20 is also connected through a capacitor 70 to ground.

Referring back again to waveform $\overline{A}$, diode 54 has a common anode connection with diode 71, the cathode of which is connected to strobe signal source 63 and to which, therefore, waveform B of FIGURE 5 is applied. The common junction of diodes 54 and 71 is connected through resistor 72 to positive voltage supply 18, and through resistor 73 and capacitor 74, in parallel, to the Nand gate NPN transistor 75. The common junction of resistor 73, the base of transistor 75 and capacitor 74 is also connected through resistor 76 to minus voltage supply 41. Nand gate transistor 75 is part of a discharge circuit with its emitter connection to ground and its collector connection through resistor 77 to the common junction of diode 64, the base of transistor 67 and capacitor 65 to give a predetermined rate discharge action of the positive charge level on capacitor 65 through resistor 77 and the collector-emitter circuit of transistor 75 to ground through varying length time intervals whenever the transistor 75 is biased to conduction in successive cycles of operation.

In the phase locked crystal controlled oscillator circuit of FIGURE 3 signal waveform change includes, at the natural resonance frequency of the crystal, nominally a total 360° phase lag through the three RC timing circuits 12, 13 and 14 particularly since they are in series connected configuration and the loop is closed back to the crystal 22. Further signal waveform change through the closed loop of the oscillator includes 360° total signal inversion in two transistor base to collector inversions through transistors 25 and 21. It should be noted that a working embodiment has been constructed that used two RC timing circuits in the loop adjusted to give 360° phase lag at the natural resonance frequency of the crystal along with the two separate signal inversion steps giving 360° total signal inversion. A further working phase locked crystal controlled oscillator embodiment has been built utilizing only 360° total signal change with only one RC timing circuit such as circuit 12 providing normally a 180° phase lag at the natural resonance frequency of the crystal 22, and the other 180° of total signal change being provided by one signal inversion step. Another workable approach is to provide a plurality of RC timing circuit steps totaling at least 360° phase lag, or multiples of 360°, at the natural resonance frequency of the crystal 22 without any signal inversion steps in the loop.

In the embodiment shown with the three RC timing circuits 12, 13 and 14 connected in series in a loop with the crystal 22, the circuit operates as an oscillator when the sum of the phase lag shifts is 360°. With this operational configuration RC timing circuit 13 utilizes such component values as to turn off its transistor for a period approximately in the range of from one-third to one-half the time period of the natural series resonance frequency of the crystal 22 and give, in analog terms, approximately a 120° to 180° phase lag. With predetermined and selected circuit component values and voltage supply potentials, and with the RC timing circuit 12 adjusted to its lowest operational voltage value of approximately 3 volts, the RC timing components result in approximately a 150° phase lag in circuit 12 at the natural series resonance of the crystal. Keep in mind that with all three of the RC timing circuits 12, 13 and 14 connected in series in the oscillator loop normally providing 360° phase lag at the natural resonant frequency of the crystal 22 that, frequency variation is accomplished by changing the value of the control voltage imparted to the RC components of RC timing circuit 12. Such control voltage variation in RC timing circuit 12 provides more or less phase lag at and above the series resonant frequency of crystal 22. This results in the crystal reacting to such changes in phase, by changing its phase lead equal in amount and in opposite direction to such phase lag variations, so as to keep the net phase shift at zero through the closed oscillator loop.

In the embodiment shown, RC timing circuit 12 is designed to allow phase shifts in the range of approximately −80° to +0° from the largest predetermined value of 150° phase lag with the result that the crystal 22 must have the capacity for shifting it sphase through substantially a range of from 0° to +80° in order to sustain oscillation in the closed oscillator loop, a function which it inherently endeavors to accomplish. Since the physical characteristics of crystals are such that crystal 22 is forced to change frequency to accomplish such phase shifts, the initial variations in control voltage in RC timing circuit 12 results in a net shift in the loop to change such that the crystal 22 is forced to offset such change with its own change. This results in the crystal oscillating in the loop at a new frequency slightly different than the former frequency. Such incremental crystal and oscillator loop frequency change versus the change in phase shift characteristics for the crystal are determined by the Q factor of the crystal. It is interesting to note that a relatively low Q crystal can be made to shift its frequency up to a higher frequency by as much as a 200 cycle per second increment above its natural series resonant frequency in the environment of the oscillator circuit illustrated, while higher Q crystals can be shifted perhaps only approximately by a +50 cycle per second increment around the series resonant frequency.

With this oscillator embodiment and various other possible phase locked crystal oscillator circuits discussed, the control voltage developed in RC timing circuit 12 is subject to variation by the relation of some oscillator circuit waveforms developed to a strobe signal input substantially at a subharmonic of the natural series resonant frequency of the crystal 22. The oscillator circuit is locked to a harmonic of the strobe frequency in the normal operation. This controlled operation is accomplished through the use of a sample circuit including two Nand gates, a charge circuit, a discharge circuit, and a sample voltage charged capacitor connected to both the charge and discharge circuits. This operation may be more thoroughly understood with reference to the waveforms A, $\bar{A}$ and B; A being a waveform developed the same or substantially the same as the second output of the oscillator circuit, and $\bar{A}$ waveform being the logic inversion of the A waveform. $\bar{A}$ is developed in an oscillator control voltage developing loop that is an auxiliary loop to the oscillator circuit loop as a part of the control voltage signal source 11 of FIGURES 1 and 3. The B waveform input strobe pulse signal is created from the leading or trailing edge of a strobe frequency signal and is applied from the strobe signal source 63 as a controlling reference signal input for the control voltage signal source circuit 11.

Waveforms A and B operate one Nand gate that effectively operates the charging circuit, referred to above, including diodes 49, 61 and 64 and the resistor 62, with charging of capacitor 65 occurring from voltage supply 18 through resistor 62 and diode 64 when both diodes 49 and 61 are simultaneously biased to nonconduction. Waveforms A and B are effective to operate the other Nand gate, transistor 75, during the intervals of time that portions of pulses of both the waveforms A and B are simultaneously positive. This Nand gate effectively acts to give a discharge path to the positive charge on capacitor 65 through resistor 77 and the collector-to-emitter path of transistor 75 to ground during each cycle of operation. The strobe operation of these gates is, with respect to the charging circuit, for the relative simultaneous times of positive pulse coincidence of waveforms A and B controlling the charge gate for charging voltage increase on the sample capacitor in proportion of the control charging time. If the oscillator loop is in stable phase lock the charge circuit will be on approximately one-half the period of the input strobe pulse signal with the waveforms upon shut off of the charge gate giving substantially immediate turn-on of the discharge gate with the sample capacitor then being discharged at approximately the same rate for substantially the same period of time that it was charged. With this combination of equal charge and discharge periods, the capacitor is continually cyclically discharged the same amount it is charged thereby retaining substantially the same net charge voltage as it had before each respective charge-discharge cycle takes place. This sample capacitor retained charge voltage is amplified in the emitter follower staging of the high impedance matching amplifier circuit 66 and fed back to the control voltage input point of RC timing circuit 12 in the main oscillator circuit loop. If the frequency of oscillation gets slightly lower than the desired frequency, the output waveform A is so phase shifted and so "and" actions together with the strobe pulse B as to increase the Nand gate actuation period of the charging circuit, and simultaneously correspondingly decrease the period of Nand gating activation of the discharge circuit. This results in a net positive voltage increase in the charge stored on the capacitor 65 thus so varying the control voltage input to RC timing circuit 12 as to cause the oscillator to shift its phase through the loop, and to thereby force the crystal to oscillate at a higher desired lock frequency. When the oscillator circuit frequency drifts higher than the desired lock frequency the discharge circuit is activated for longer periods and the charge circuit for correspondingly shorter periods resulting in a net lower positive voltage charge and lower positive control voltage input to the RC timing circuit 12. This, obviously, operates in reverse to decrease the frequency of the oscillator circuit back to the desired lock frequency. Resistor 69 and capacitor 70 in the connection between circuit 66 and RC timing circuit 12 act as a ripple filter minimizing the effect of cyclic charging and discharging ripple voltage variations in the controlling voltage developed and applied as a control voltage input to the RC timing circuit 12.

Components and values used with a working embodiment of the oscillator circuit illustrated and described with the crystal having substantially a 176 kc. natural series resonant frequency, and with the operation of the oscillator circuit variable in phase and frequency lock control through approximately the range of −5 c.p.s. to +90 c.p.s. with the circuit using the same component values having a possible extension of range of approximately 168 kc. to 191 kc. with appropriate substitution of crystals for operational range steps desired, include the following:

| | | |
|---|---|---|
| PNP transistors **16** and **38** | | 2N2907A |
| Resistor **17** | ohms | 3.3K |
| Voltage supply **18** | volts | +18 |
| Capacitor **19** | pf | 1200 |
| Resistors **20**, **23**, **34** and **37** | ohms | 4.7K |
| NPN transistors **21**, **25**, **31**, **32**, **43**, **51**, **56**, **67**, **68** and **75** | | 2N914 |
| Crystal **22** | kc. DT cut | 176 |
| Diodes **26**, **29**, **33**, **35**, **49**, **53**, **54**, **61**, **64** and **71** | | 1N914 |
| Resistors **27**, **52**, and **76** | ohms | 33K |
| Voltage supply **28** | volts | +5 |

| | | |
|---|---|---|
| Resistors 30 and 77 | ohms | 10K |
| Capacitor 36 | pf | 860 |
| Capacitor 39 | do | 39 |
| Resistors 40, 45, and 58 | ohms | 6.8K |
| Voltage supply 41 | volts | −6 |
| Capacitors 42 and 55 | pf | 220 |
| Resistors 46, 57, 59 and 69 | ohms | 1K |
| Resistor 50 | do | 22K |
| Resistor 62 | do | 3.9K |
| Capacitor 65 | pf | 500 |
| Capacitor 70 | μf | 1 |
| Resistors 72 and 73 | ohms | 15K |
| Capacitor 74 | pf | 5 |

Obviously, there could be various voltage supply variations from the arrangements shown. Positive voltage supplies 18 and 28 could be combined into one positive supply and various circuit component values could be adjusted for developing the respective bias voltages desired.

Whereas this invention is here illustrated and described with respect to a specific embodiment thereof, it should be realized that various changes may be made without departing from the essential contribution to the art made by the teachings hereof.

I claim:

1. In a phase locked crystal controlled oscillator circuit, a crystal having a predetermined selected natural series resonance fresuency; circuit loop means including said crystal, and signal changing circuit means giving at least 360° signal change, with phase shifting means capable of giving at least 180° of the signal change; means for developing a pulse waveform output from said oscillator circuit at the frequency of said crystal; a subharmonic, relative to the frequency of said crystal, strobe pulse reference signal source input means to said oscillator circuit; a voltage sample storing circuit; voltage means for charging said voltage sample storing circuit; charge circuit gating action means connected to respond to simultaneous coincidence of pulse portions of said pulse waveform output and said strobe reference signal, and connected to both the voltage means and the voltage storing circuit to gate charge said voltage storing circuit throughout substantially each period of simultaneous coincidence of the pulse portions; discharge circuit means connected to said voltage sample storing circuit and including discharge action gating means; said discharge action gating means connected to said pulse waveform output means and to said strobe pulse reference signal source for activation and discharging of said voltage sample storing circuit substantially throughout each period of simultanteous coincidence of non pulse portions of the pulse waveform output and pulses of the strobe pulse reference signal; said phase shifting including a phase shift timing circuit; and circuit means interconnecting said voltage sample storing circiut and said phase shift timing circuit for the voltage level of the voltage sample stored, as applied through the interconnecting circuit means to the phase shift timing circuit, to be a phase shift controlling voltage input.

2. The phase locked crystal controlled oscillator circuit of claim 1, wherein said phase shifting means is capable of giving at least 360° signal change.

3. The phase locked crystal controlled oscillator circuit of claim 2, wherein said phase shifting means includes at least two RC phase lag timing circuits in the circuit loop.

4. The phase locked crystal controlled oscillator circut of claim 1, including signal function inverting means and wherein at least 180° of the signal change is by signal inversion.

5. The phase locked crystal controlled oscillator circuit of claim 4, wherein phase shifting means is capable of giving at least 360° signal change; and said signal function inverting means includes two signal function inversion devices in the oscillator loop.

6. The phase locked crystal controlled oscillator of claim 5, wherein said phase shifting means includes three RC phase lag timing circuits in the circuit loop, and with at least one of said RC phase lag timing circuits located between said two signal function inversion devices in the loop.

7. The phase locked crystal controlled oscillator of claim 1, wherein the connection between said pulse waveform output means and said discharge action gating means includes signal logic inverting means for developing the inverse of said output for activation and discharging of said voltage sample storing circuit substantially throughout each period of simultaneous coincidence of the pulse portions of the signal logic inverted waveform and pulses of the strobe pulse reference signal waveform.

8. The phase locked crystal controlled oscillator of claim 1, wherein both the charge circuit gating action means and the discharge action gating means are Nand gating means.

9. The phase locked crystal controlled oscillator of claim 8, wherein the charge circuit gating action means includes three diodes having a common electrode connection that is also connected to a DC voltage supply, and with the opposite diode electrodes connected, respectively, to the pulse waveform output means, to the strobe pulse reference signal source, and to said voltage sample storing circuit.

10. The phase locked crystal controlled oscillator of claim 8, wherein the discharge action gating means includes a transistor with an emitter collector path in said discharge circuit means, and a base connection to a common junction between like electrodes of two diodes with opposite electrodes connected respectively to the pulse waveform output means, and to the strobe pulse reference signal source.

11. The phase locked crystal controlled oscillator of claim 10, wherein, the connection between a diode, connected to the discharge action gating means, to the pulse waveform output means includes, a signal logic inverter device; voltage bias developing connection means between the base of said transistor and voltage supply means; and a connection of said discharge circuit means to a voltage potential reference source.

12. The phase locked crystal controlled oscillator of claim 1 wherein said voltage sample storing circuit includes a voltage sample storing capacitor.

13. The phase locked crystal controlled oscillator of claim 12 including, a high impedance matching and amplifier circuit in the circuit means interconnecting said voltage sample storing circuit and said phase shift timing circuit.

14. The phase locked crystal controlled oscillator of claim 13 wherein, the circuit means interconnecting the voltage sample storing circuit and said phase shift circuit includes an RC ripple filter between said high impedance matching and amplifier circuit and said phase shift timing circuit.

No references cited.

ROY LAKE, *Primary Examiner.*

S. H. GRIMM, *Assistant Examiner.*

UNITED STATES PATENT OFFICE

CERTIFICATE OF CORRECTION

Patent No. 3,345,579 October 3, 1967

George C. Wilkinson, Jr.

It is certified that error appears in the above identified patent and that said Letters Patent are hereby corrected as shown below:

Column 7, line 28, for "fresuency" read -- frequency --; line 41, after "voltage" , second occurrence, insert -- sample --; line 42, after "voltage" insert -- sample --; line 53, after "shifting" insert -- means --.

Signed and sealed this 22nd day of July 1969.

(SEAL)
Attest:

Edward M. Fletcher, Jr.
Attesting Officer

WILLIAM E. SCHUYLER, JR.
Commissioner of Patents